United States Patent
Tanaka (10) Patent No.: US 6,536,030 B1
(45) Date of Patent: Mar. 18, 2003

(54) MACROBLOCK FOR USE IN LAYOUT DESIGN OF SEMICONDUCTOR INTEGRATED CIRCUIT, STORAGE MEDIUM FOR STORING INTELLECTUAL PROPERTY INCLUDING INFORMATION ON THE MACROBLOCK, AND LAYOUT DESIGN METHOD USING THE MACROBLOCK

(75) Inventor: Genichi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/568,538

(22) Filed: May 11, 2000

(30) Foreign Application Priority Data

Nov. 16, 1999 (JP) .......................................... 11-325816

(51) Int. Cl.$^7$ .............................................. G06F 17/50
(52) U.S. Cl. ............................... 716/17; 716/8; 716/11; 716/16
(58) Field of Search ....................................... 716/1–21

(56) References Cited

U.S. PATENT DOCUMENTS 5,564,022 A * 10/1996 Debnath et al. ............ 395/250
6,009,253 A * 12/1999 Srivatsa et al. ........ 395/500.07
6,262,993 B1 * 7/2001 Kirmse ....................... 370/463
6,272,667 B1 * 8/2001 Minami et al. ............. 370/463

FOREIGN PATENT DOCUMENTS

JP          11-145292        5/1999

* cited by examiner

Primary Examiner—Vuthe Siek
(74) Attorney, Agent, or Firm—Burns, Doane, Swecker & Mathis, LLP (57) ABSTRACT

A macroblock is treated as a single unit when creating a layout for a semiconductor integrated circuit. The macroblock comprises at least a cell for implementing one or more functions which the macroblock has to perform, and a plurality of through path forming cells each used for forming a through path passing through the macroblock, the plurality of through path forming cells being inserted into the macroblock in advance of creating a layout for a semiconductor integrated circuit so that they are spread over the macroblock in a predetermined way. Preferably, each of the plurality of through path forming cells is a buffer.

4 Claims, 6 Drawing Sheets

MACROBLOCK FOR USE IN LAYOUT DESIGN OF SEMICONDUCTOR INTEGRATED CIRCUIT, STORAGE MEDIUM FOR STORING INTELLECTUAL PROPERTY INCLUDING INFORMATION ON THE MACROBLOCK, AND LAYOUT DESIGN METHOD USING THE MACROBLOCK

BACKGROUND OF THE INVENTION

1. Field of the Invention

The present invention relates to a macroblock that is treated as a single unit when designing the layout of a semiconductor integrated circuit, a storage medium for storing intellectual property, which is abbreviated as IP here on, including information on the macroblock, and a method of creating a layout for a semiconductor integrated circuit using the macroblock.

2. Description of the Prior Art

A conventional macroblock consists of a group of cells, each of which implements each of a plurality of functions. When configuring layers in the design of the layout of a semiconductor integrated circuit, at least a macroblock that constitutes the semiconductor integrated circuit is arranged and macrocells (or macroblocks) that are not associated with the former macroblock are connected to one another so that paths for connecting the macrocells to one another go around or over the former macroblock.

Figure 10:
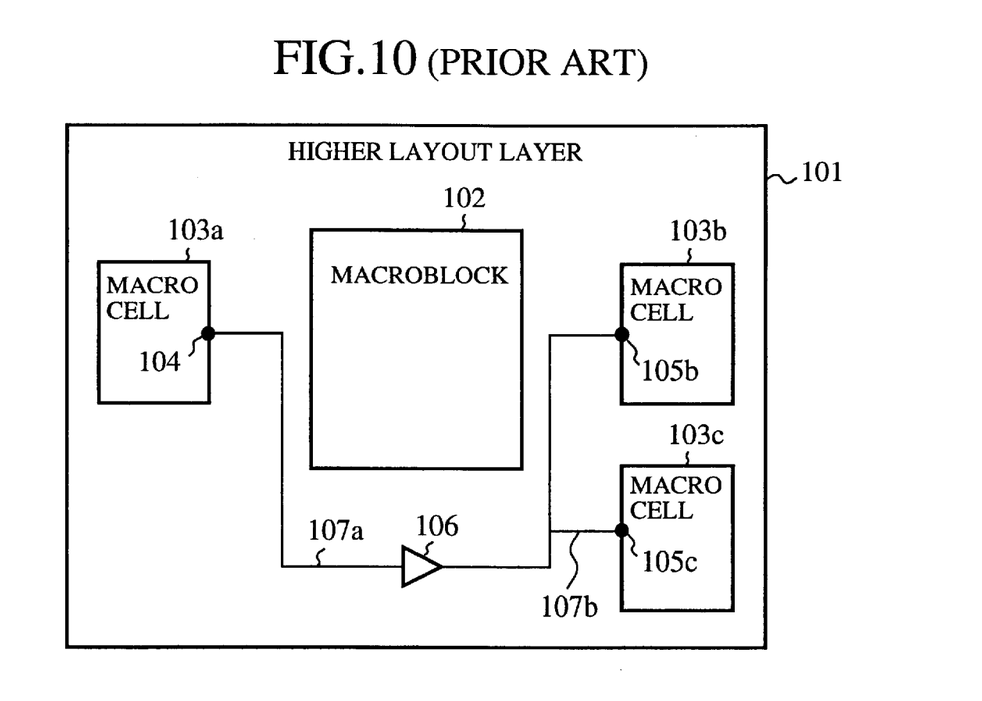
FIG. 10 is a block diagram showing the structure of a higher layout layer in which a prior art macroblock is placed.

Referring next to FIG. 10, it illustrates a diagram showing the structure of a higher layout layer in which a conventional macroblock is disposed. In the figure, reference numeral 101 denotes the higher layout layer, numeral 102 denotes the conventional macroblock, and numeral 103a to 103c denote macrocells or macroblocks, which will be referred to as macrocell hereinafter for simplicity. The plurality of macrocells shown in FIG. 10 have a net that is not connected to the macroblock 101. Furthermore, reference numeral 104 denotes an output port of the first macrocell 103a for driving the net, numerals 105b and 105c denote respective input ports of the second and third macrocells 103b and 103c that are driven by the first macrocell, numeral 106 denotes a buffer that is inserted for improving the time delay caused between the output port 104 and the input port 105, numeral 107a denotes a path for connecting the output port 104 of the first macrocell 103 for driving the net to the input terminal of the buffer 106, and numeral 107b denotes a path for connecting the output terminal of the buffer 106 to the input ports 105b and 105c of the second and third macrocells 103b and 103c that are driven by the first macrocell.

Next, the description will be directed to the layout design of a semiconductor integrated circuit. When configuring a layer at a higher level using the conventional macroblock 102, the plurality of macrocells 103a to 103c and the macroblock 102 are arranged in the higher layout layer 101. The macroblock 102 includes no buffer used for improving the time delay caused between the plurality of macrocells 103a to 103c which are not associated with the macroblock 102. Therefore, in the higher layout layer 101 the buffer 106 is additionally disposed outside the macroblock 102. The paths 107a and 107b connect the output port 104 of the first macrocell 103a for driving the net, which is not connected to the macroblock 102, by way of the buffer 106, to the input ports 105b and 105c of the second and third macrocells that are driven by the first macrocell. The paths go around the macroblock 102.

Since the buffer 106 is not disposed within the macroblock 102, the paths 107a and 107b for connecting the output port 104 of the first macrocell 103a for driving the net, which is not connected to the macroblock 102, to the input ports 105b and 105c of the second and third macrocells 103b and 103c that are driven by the first macrocell has to be wired so as to go around the macroblock 102.

Japanese Patent Application Publication (TOKKAIHEI) No. 11-145292 discloses such a conventional macroblock, for example.

A problem that arises when designing the layout of a semiconductor integrated circuit using a conventional macroblock constructed as above is that when there is a need to insert a buffer or the like into a through path for connecting macrocells that are not associated with the macroblock with one another in order to improve the time delay caused between the macrocells, an additional buffer or the like has to be disposed outside the macroblock so as to connect the macrocells to one another because the macroblock includes no buffer, and, when the macrocells are arranged while facing with one another with the macroblock between, the through path for connecting the macrocells with one another has to be wired so as to go around the macroblock and the length of the through path is therefore increased. In particular, this tendency is strengthened when designing the top layout layer.

SUMMARY OF THE INVENTION

The present invention is proposed to solve the above problem. It is therefore an object of the present invention to provide a macroblock capable of reducing the length of wiring between macrocells disposed with facing with each other with the macroblock between, therefore speeding up a semiconductor integrated circuit using such a macroblock, reducing the power consumption, downsizing the semiconductor integrated circuit, and designing the layout and wiring of the semiconductor integrated circuit with efficiency.

It is a further object of the present invention to provide a storage medium for storing IP of the macroblock.

It is another object of the present invention to provide a method of creating a layout for a semiconductor integrated circuit using at least a macroblock, the method being capable of reducing the length of wiring between macrocells disposed outside the macroblock with facing with each other with the macroblock between.

In accordance with one aspect of the present invention, there is provided a macroblock that is treated as a single unit when creating a layout for a semiconductor integrated circuit, the macroblock comprising: at least a cell for implementing one or more functions which the macroblock has to perform; and a plurality of through path forming-cells each used for forming a through path passing through the macroblock, the plurality of through path forming cells being inserted into the macroblock in advance of creating a layout for a semiconductor integrated circuit so that they are spread over the macroblock in a predetermined way.

Preferably, each of the plurality of through path forming cells is a buffer. As an alternative, each of the plurality of through path forming cells is an inverter. Each of the plurality of through path forming cells can alternatively be a clock control cell for controlling a clock applied thereto. Preferably, each of the plurality of through path forming cells is a latch. As an alternative, each of the plurality of through path forming cells is a flip-flop.

Preferably, the plurality of through path forming cells include at least two types of components selected from among buffers, inverters, clock control cells for controlling a clock applied thereto, latches, and flip-flops.

In accordance with a preferred embodiment of the present invention, the macroblock further comprises a through path defined in the macroblock in advance of creating a layout for a semiconductor integrated circuit and connected to each of the plurality of through path forming cells, for establishing connection between cells disposed outside the macroblock.

In accordance with another preferred embodiment of the present invention, the macroblock further comprises a plurality of through path possibilities defined in the macroblock in advance of creating a layout for a semiconductor integrated circuit and connected to each of the plurality of through path forming cells, one of the plurality of through path possibilities being selected to establish connection between cells disposed outside the macroblock when creating a layout for a semiconductor integrated circuit.

In accordance with another aspect of the present invention, there is provided a computer-readable storage medium including an intellectual property or IP core, the IP code including: information on a macroblock used when creating a layout for a semiconductor integrated circuit; and information on a plurality of through path forming cells each used for forming a through path passing through the macroblock, the plurality of through path forming cells being inserted into the macroblock.

In accordance with a further aspect of the present invention, there is provided a method of creating a layout for a semiconductor integrated circuit using at least a macroblock, the macroblock including: a plurality of.through path forming cells each used for forming a through path passing through the macroblock, the plurality of through path forming cells being inserted into the macroblock in advance of creating a layout for a semiconductor integrated circuit so that they are spread over the macroblock in a predetermined way.

Preferably, the method comprises the steps of creating a layout for the macroblock into which the plurality of through path forming cells are inserted using a netlist including information on logical connections, the netlist being prepared in advance of creating the layout, determining whether layout results meet constraints, creating a new layout for the macroblock using the plurality of through path forming cells as well unless the layout results meet the constraints, and repeating the determining and creating steps until the layout results meet the constraints.

As an alternative, the method comprises the steps of creating a layout for the macroblock into which the plurality of through path forming cells are inserted using a netlist including information on logical connections, the netlist being created or modified in consideration of the plurality of through path forming cells, determining whether layout results meet constraints, creating a new layout for the macroblock using the plurality of through path forming cells as well unless the layout results meet the constraints, and repeating the determining and creating steps until the layout results meet the constraints.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
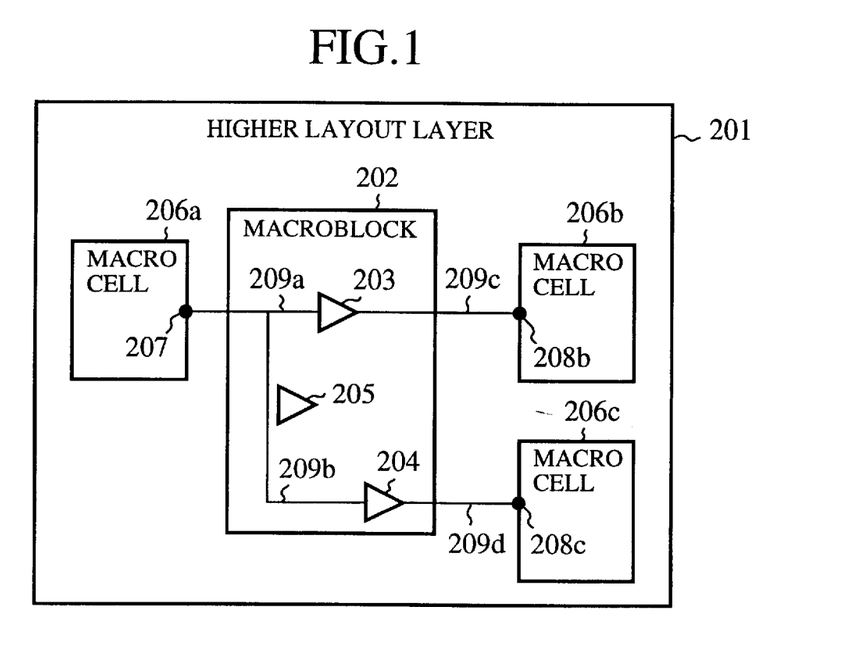
FIG. 1 is a block diagram showing the structure of a higher layout layer in which a macroblock according to a first embodiment of the present invention is placed.

Referring next to FIG. 1, it illustrates a block diagram showing the structure of a higher layout layer in which a macroblock according to a first embodiment of the present invention is disposed. The example of the higher layout layer of FIG. 1 shows that the macroblock of the first embodiment is used to connect a plurality of macrocells to one another by means of buffers inserted into the macroblock, when creating a layout at a higher level. In the figure, reference numeral 201 denotes the higher layout layer, and numeral 202 denotes the macroblock according to the first embodiment of the present invention placed in the higher layout layer 201. The macroblock 202 includes a plurality of cells (not shown) that respectively implements a plurality of functions, which are to be performed by the macroblock 202.

Reference numerals 203, 204, and 205 denote buffers inserted into the macroblock 202, each of which serves as a cell (referred to as through path forming cell here on) used for forming a through path passing through the macroblock 202 to connect a cell disposed outside the macroblock 202 to another cell disposed outside the macroblock 202. Those buffers are inserted into the macroblock 202 so that they are spread over an area of the macroblock 202, as shown in FIG. 1, in a predetermined way, preferably, in such a way that some buffers are located in the vicinity of each of the upper, lower, left-hand, and right-hand sides of the macroblock and some buffers are located in the vicinity of the center of the macroblock. The buffer 203 is placed at an upper part of the macroblock 202 just above the center and is used to form a through path passing through the macroblock 202. The buffer 204 is placed at a lower right-hand part of the macroblock 202 and is used to form another through path passing through the macroblock 202. The buffer 205 is placed to the left of the center of the macroblock 202 and is not used to form any through path passing through the macroblock 202.

In addition, reference numeral 206a denotes a cell (abbreviated as macrocell here on) for driving a net not connected to the macroblock 202, such as a macrocell, a macroblock, an I/O pin, or an I/O PAD, numerals 206b and 206c denote cells (or macrocells) connected to the net, those macrocells 206b and 206c being driven by the first macrocell 206a, numeral 207 denotes an output port of the first macrocell 206a for driving the net, numerals 208b and 208c denote respective input ports of the second and third macrocells 206b and 206c that are driven by the first macrocell 206a, numeral 209a denotes a path for connecting the input terminal of the buffer 203 to the output port 207 of the first macrocell 206a, numeral 209b denotes a line for connecting the input terminal of the buffer 204 to the output port 207 of the first macrocell 206a, 209c denotes a path for connecting the output terminal of the buffer 203 to the input port 208b of the second macrocell 206b, and 209d denotes a path for connecting the output terminal of the buffer 204 to the input port 208c of the third macrocell 206c. The macroblock 202 including those buffers 203 to 205 inserted thereinto thus makes it possible to connect the first macrocell 206a for driving the net to the second and third macrocells 206b and 206c that are driven by the first macrocell 206a by means of the plurality of routing paths 209a to 209d without having to provide additional paths that bypass the macroblock 202.

Figure 2:
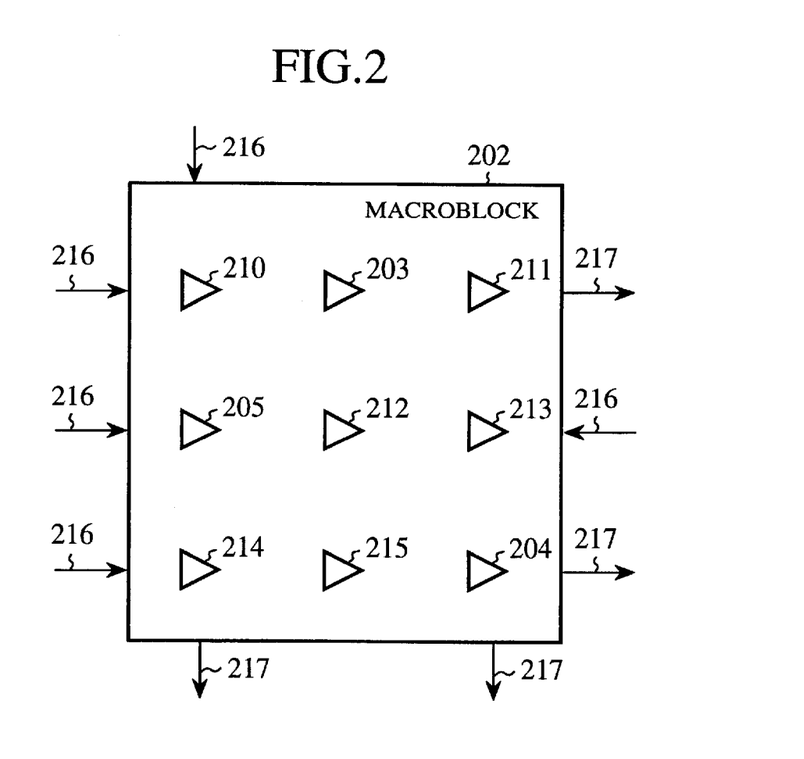
FIG. 2 is a diagram showing a configuration of a plurality of buffers, each of which serves as a cell used for forming a through path passing through the macroblock to connect a cell disposed outside the macroblock to another cell disposed outside the macroblock.

Referring next to FIG. 2, it illustrates a diagram showing a configuration of a plurality of buffers, each of which serves as a through path forming cell and which are inserted into the macroblock 202 so that they are spread over the area of the macroblock in a predetermined way. In the figure, reference numerals 210, 211, 212, 213, 214, and 215 denote buffers, each of which is the same as each of the buffers 203 to 205, i.e., each of which serves as a through path forming cell. It is noted that FIG. 2 shows the configuration of those buffers 203 to 205 and 210 to 215 inserted into the macroblock 202, whereas FIG. 1 shows only the buffers 203 to 205 included with the macroblock 202. As shown in FIG. 2, the plurality of buffers can be uniformly spread over the area of the macroblock 202 in a regular way. As an alternative, the plurality of buffers can be spread over the area of the macroblock 202 in a specific way defined by a design floor plan.

Reference numerals 216 and 217 denote arrows each showing a direction in which a path passing through the macroblock 202 is accessed. The example of the macroblock 202 as shown in FIG. 2 has to provide a plurality of paths extending from a plurality of arrows 216, by way of the plurality of buffers 203 to 205 and 210 to 215 disposed within the macroblock 202, to a plurality of arrows 217. For example, when there is a need to provide a path extending from the arrow 216 at the top of the left-hand side of the macroblock 202 to the arrow 217 at the bottom of the right-hand side of the macroblock 202, some buffers can be selected, as a basic selection, to form the shortest path. In other words, the buffer 210, 212, or 204 can be selected to form the shortest path. In this case, one of those buffers can be selected in consideration of the status of input at the arrow 216 and the status of output at the arrow 217. For example, if the input at the arrow 216 has a high driving capability or the output at the arrow 217 has a large load (e.g., capacity) when the load, such as capacity, imposed on the input at the arrow 216 is small, the buffer 204 is selected. The selection of the buffer 204 makes it possible to reduce the load on the output (i.e., the arrow 217) and to increase the load on the input (i.e., the arrow 216). In contrast, when there is a need to decrease the load on the input because the input at the arrow 216 has a low driving capability, the buffer 210 is selected to that end. In order to control the loads on the input and output, the plurality of buffers can be uniformly spread over the area of the macroblock 202, typically. As an alternative, the plurality of buffers can be spread over the area of the macroblock 202 so that some buffers are located in the vicinity of each of the upper, lower, left-hand, and right-hand sides of the macroblock and some buffers are located in the vicinity of the center of the macroblock.

When it is determined in advance from a higher-level design floor plan that no access from cells located above the upper side of the macroblock is made via the macroblock, no buffer is placed in the vicinity of the upper side of the macroblock 202. When the macroblock 202 includes a specific functional block (or cell) that cannot allow any wiring, such as a through path passing through the macroblock 202, other than wiring installed within the macroblock 202, to pass by the functional block, in order to implement a specific function, no buffer is placed in the vicinity of an area in which the functional block is located.

As previously mentioned, in accordance with the first embodiment of the present invention, a plurality of buffers 203 to 205 and 210 to 215 can be inserted into the macroblock 202 so that they are spread over the area of the macroblock 202 in a regular way, preferably, in such a way that some buffers are located in the vicinity of each of the upper, lower, left-hand, and right-hand sides of the macroblock and some buffers are located in the vicinity of the center of the macroblock. Accordingly, the macroblock 202 can connect a plurality of macrocells, which are not associated with the macroblock 202, to one another by way of some of the plurality of buffers 203 to 205 and 210 to 215 using a plurality of paths wired therein without having to provide additional paths, which bypass the macroblock 202, for connecting at least a macrocell for driving a net to one or more macrocells that are driven by the former macrocell, thus reducing the length of wiring required for connecting the plurality of macrocells to one another. Furthermore, since one or more buffers best suited to connect the plurality of macrocells to one another can be selected from among the plurality of buffers 203 to 205 and 210 to 215, the time delay caused between the plurality of macrocells 206 can be reduced, thus speeding up the circuitry.

The plurality of buffers 203 to 205 and 210 to 215 can be placed almost anywhere so that they are spread over the area of the macroblock 202 in a predetermined way. This results in making it possible to offer a wide choice of buffers 203 to 205 and 210 to 215 in a higher layer, and therefore control and reduce the length of wiring required for connecting the plurality of macrocells, thus reducing the driving capability of a macrocell for driving the wiring. In addition, since the area occupied by a semiconductor integrated circuit including the macroblock can be reduced and the amount of current flowing through the macroblock and hence the semiconductor integrated circuit can be reduced, the power consumption can be reduced and causes compromising the signal integrity, such as hot electron and crosstalk, can be reduced. Furthermore, since there is no need to provide redundant wiring for connecting the plurality of macrocells to one another, a larger area can be provided to install other wiring in the higher layout layer, so that the other wiring can be carried out with efficiency, thus further reducing the area occupied by the semiconductor integrated circuit including the macroblock.

Embodiment 2

Figure 3:
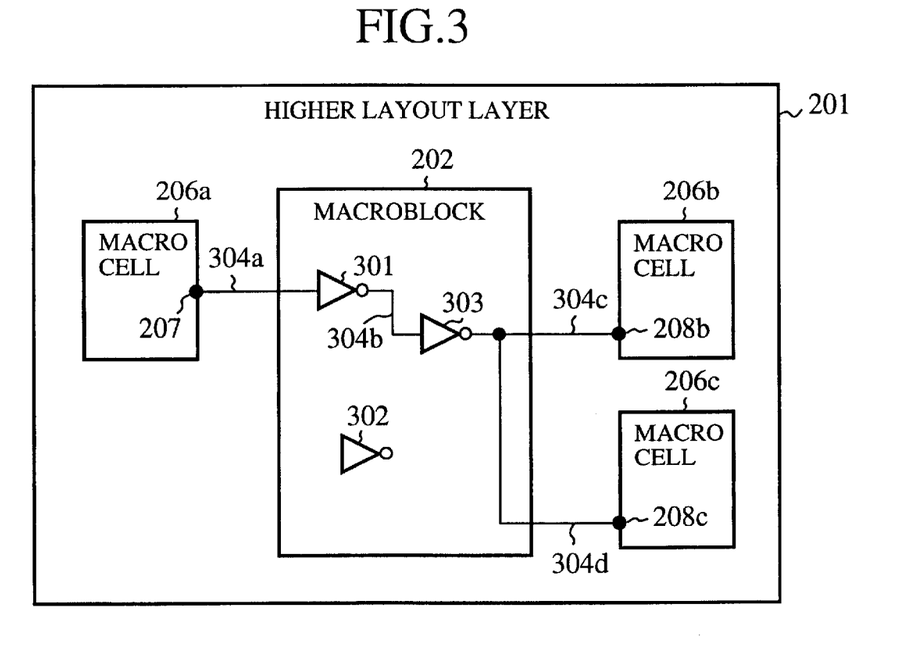
FIG. 3 is a block diagram showing the structure of a higher layout layer in which a macroblock according to a second embodiment of the present invention is placed.

In the above-mentioned first embodiment, a plurality of buffers, each of which serves as a through path forming cell used for forming a through path passing through a macroblock to connect a cell disposed outside the macroblock to another cell disposed outside the macroblock, are inserted into the macroblock so that they are spread over the area of the macroblock. In contrast, in accordance with a second embodiment of the present invention, a plurality of inverters, each of which serves as a through path forming cell, can be inserted into a macroblock so that they are spread over the area of the macroblock. Referring next to FIG. 3, it illustrates a block diagram showing the structure of a higher layout layer in which a macroblock according to a second embodiment of the present invention is placed. The example of the higher layout layer of FIG. 3 shows that the macroblock of the second embodiment is used to connect a plurality of macrocells to one another by means of inverters inserted into the macroblock, when creating a layout at a higher level. In the figure, reference numeral 201 denotes the higher layout layer, and numeral 202 denotes the macroblock according to the second embodiment of the present invention disposed in the higher layout layer 201. In addition, reference numeral 206a denotes a cell (abbreviated as macrocell here on) for driving a net not connected to the macroblock 202, such as a macrocell, a macroblock, an I/O pin, or an I/O PAD, numerals 206b and 206c denote macrocells that are driven by the first macrocell 206a, numeral 207 denotes an output port of the first macrocell 206a, numeral 208b denotes an input port of the second macrocell 206b, and numeral 208c denotes an input port of the third macrocell 206c. Those components correspond to the components of the first embodiment designated by the same reference numerals as shown in FIG. 1, respectively.

Reference numerals 301, 302 and 303 denote inverters inserted into the macroblock 202, each of which serves as a through path forming cell used for forming a through path passing through the macroblock 202 to connect a cell disposed outside the macroblock 202 to another cell disposed outside the macroblock 202, instead of the buffers 203 to 205 and 210 to 215. The macroblock 202 can involve a plurality of inverters including the inverters 301 to 303. The inverters 301 and 303 are used to form a through path passing through the macroblock 202. The inverter 302 is not used to form any through path passing through the macroblock 202. The plurality of inverters are inserted into the macroblock 202 so that they are spread over the area of the macroblock 202, as shown in FIG. 2, in a regular way, preferably, in such a way that some inverters are placed in the vicinity of each of the upper, lower, left-hand, and right-hand sides of the macroblock and some inverters are placed in the vicinity of the center of the macroblock. Furthermore, reference numeral 304a denotes a path for connecting the input terminal of the first inverter 301 to the output port 207 of the first macrocell 206a, numeral 303b denotes a path for connecting the input terminal of the third inverter 303 to the output terminal of the first inverter 301, 304c denotes a path for connecting the output terminal of the third inverter 303 to the input port 208b of the second macrocell 206b, and 304d denotes a path for connecting the output terminal of the third inverter 303 to the input port 208c of the third macrocell 206c. The macroblock 202 includes a plurality of cells (not shown) that respectively implements a plurality of functions, which are to be performed by the macroblock 202.

In this manner, when connecting the first macrocell 206a for driving the net to the second and third macrocells 206b and 206c that are driven by the first macrocell 206a, the macroblock 202 including those inverters 301 to 303 inserted thereinto thus makes it possible to connect those macrocells to one another by connecting the output port 207 of the first macrocell 206a to the input ports 208b and 208c of the second and third macrocells 206b and 206c by means of the plurality of paths 304a to 304d that do not bypass the macroblock 202. In other words, the two inverters 301 and 303 can take the place of the buffers 203 and 204 according to the first embodiment, as shown in FIG. 1, to connect the output port 207 of the first macrocell 206 for driving the net to the input ports 208b and 208c of the second and third macrocells 206b and 206c that are driven by the first macrocell 206a. As an alternative, an odd number of inverters 301 can take the place of the buffers 203 and 204 to connect the plurality of macrocells 206a, 206b and 206c to one another. In this case, each of the second and third macrocells 206b and 206c that are driven by the first macrocell can receive inverted data by way of its input port.

As previously mentioned, in accordance with the second embodiment, a plurality of inverters, each of which serves as a through path forming cell used for forming a through path passing through the macroblock 202 to connect a cell disposed outside the macroblock 202 to another cell disposed outside the macroblock 202, can be inserted into the macroblock 202 so that they are spread over the area of the macroblock 202 in a predetermined way. Accordingly, the second embodiment can offer the advantages of speeding up the circuitry, reducing the power consumption, reducing the area occupied by a semiconductor integrated circuit including the macroblock, and installing wiring with efficiency, like the first embodiment. In addition, the second embodiment offers the advantage of being able to easily control whether to invert data to be furnished to the input port of a macrocell that is driven by changing the number of inverters, via which a connection is established between the macrocell that is driven and another macrocell for driving the net, between an odd number and an even number.

Embodiment 3

Figure 4:
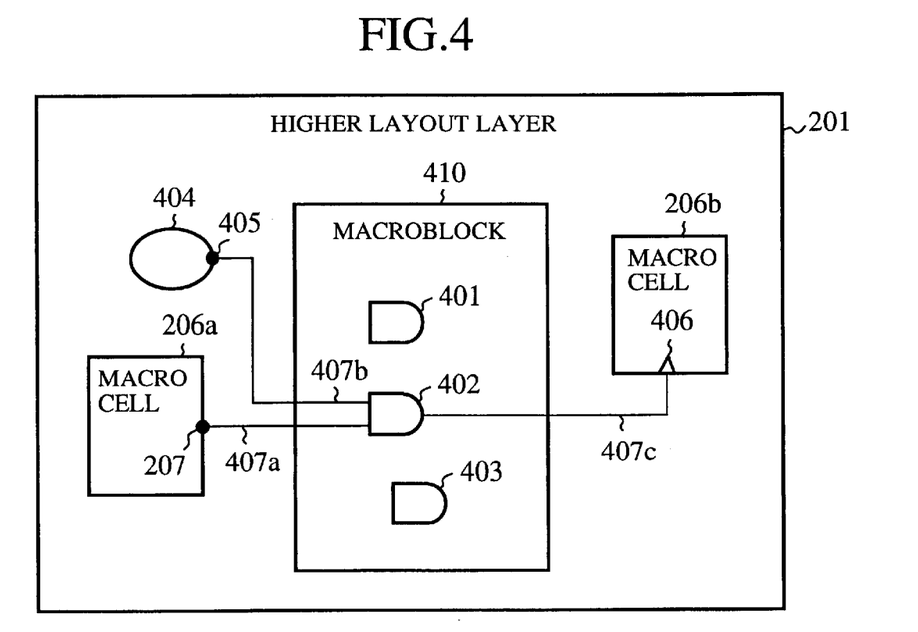
FIG. 4 is a block diagram showing the structure of a higher layout layer in which a macroblock according to a third embodiment of the present invention is placed.

In the above-mentioned first or second embodiment, a plurality of buffers or inverters, each of which serves as a through path forming cell used for forming a through path passing through a macroblock to connect a cell disposed outside the macroblock to another cell disposed outside the macroblock, are inserted into the macroblock so that they are spread over the area of the macroblock. In contrast, in accordance with a third embodiment of the present invention, a plurality of clock control cells, each of which .serves as a through path forming cell to form a clock net passing through a macroblock, can be inserted into the macroblock so that they are spread over the area of the macroblock. Referring next to FIG. 4, it illustrates a block diagram showing the structure of a higher layout layer in which the macroblock according to a third embodiment of the present invention is disposed. The example of the higher layout layer as shown in FIG. 4 shows that the macroblock of the third embodiment is used to connect a plurality of macrocells to one another by means of clock control cells inserted into the macroblock, when creating a layout at a higher level. In the figure, reference numeral 201 denotes the higher layout layer, numeral 206a denotes a cell (abbreviated as macrocell here on) for driving a net not connected to the macroblock, such as a macrocell, a macroblock, an I/O pin, or an I/O PAD, numeral 206b denotes a macrocell that is driven by the first macrocell 206a, and numeral 207 denotes an output port of the first macrocell 206a for driving the net. Those components correspond to the components of the first embodiment designated by the same reference numerals as shown in FIG. 1, respectively.

In addition, reference numeral 410 denotes the macroblock according to the third embodiment of the present invention, which can be disposed in the higher layout layer 201 when the wiring passing through the macroblock is a clock net, numerals 401, 402 and 403 denote clock control cells inserted into the macroblock 410, each of which serves as a through path forming cell used for forming a through path (or through clock net) passing through the macroblock 410 to connect a cell disposed outside the macroblock 410 to another cell disposed outside the macroblock 410. The clock control cell 402 is used to form a clock net passing through the macroblock 410. In contrast, the clock control cells 401 and 403 are not used to form any clock net passing through the macroblock 410. The macroblock 410 can involve a plurality of clock control cells including those clock control cells 401 to 403. The plurality of clock control cells are inserted into the macroblock 410 so that they are spread over the area of the macroblock 410, as shown in FIG. 2, in a predetermined way, preferably, in such a way that some clock control cells are placed in the vicinity of each of the upper, lower, left-hand, and right-hand sides of the macroblock and some clock control cells are placed in the vicinity of the center of the macroblock.

Furthermore, reference numeral 404 denotes a clock control signal generating block for generating a clock control signal, numeral 405 denotes a clock control signal output port via which the clock control signal generating block 404 furnishes the clock control signal, numeral 406 denotes a clock input port via which the second macrocell 206b that is driven by the first macrocell receives a clock, numeral 407a denotes a path for connecting an input terminal of the second clock control cell 402 to the output port 207 of the first macrocell 206a, numeral 407b denotes a path for connecting another input terminal of the second clock control cell 402 to the clock control signal output port 405 of the clock control signal generating block 404, and numeral 407c denotes a path for connecting the output terminal of the second clock control cell 402 to the clock input port 406 of the second macrocell 206b. The macroblock 410 includes a plurality of cells (not shown) that respectively implements a plurality of functions which the macroblock 410 has to perform.

In this manner, the macroblock 410 including the clock control cell 402 inserted thereinto makes it possible to transfer a clock between the first and second macrocells 206a and 206b that are not associated with the macroblock 410 by connecting the output port 207 of the first macrocell 206a to the clock input port 406 of the second macrocell 206b using the paths 407a and 407c that do not bypass the macroblock 410 and by controlling the clock control cell 402 with the clock control signal generated by the clock control signal generating block 404. In other words, the macroblock 410 including the clock control cell 402 inserted thereinto makes it possible to furnish a clock from the output port 207 of the first macrocell 206a for driving the net, by way of the paths 407a and 407c that do not bypass the macroblock 410, to the clock input port 406 of the second macrocell 206b that is driven by the first macrocell.

As previously mentioned, in accordance with the third embodiment, a plurality of clock control cells including the clock control cells 401 to 403, each of which serves as a through path forming cell used for forming a through path passing through the macroblock 410 to connect a cell disposed outside the macroblock 410 to another cell disposed outside the macroblock 410, can be inserted into the macroblock 410 so that they are spread over the area of the macroblock 410. Accordingly, the third embodiment can offer the advantages of speeding up the circuitry, reducing the power consumption, reducing the area occupied by a semiconductor integrated circuit including the macroblock, and installing wiring with efficiency, like the first embodiment. In addition, since the third embodiment can be applied to the case that the wiring passing through the macroblock 410 is a clock net, the amount of current flowing through the clock net can be reduced and hence electro magnetic interference or EMI can be reduced.

Embodiment 4

Figure 5:
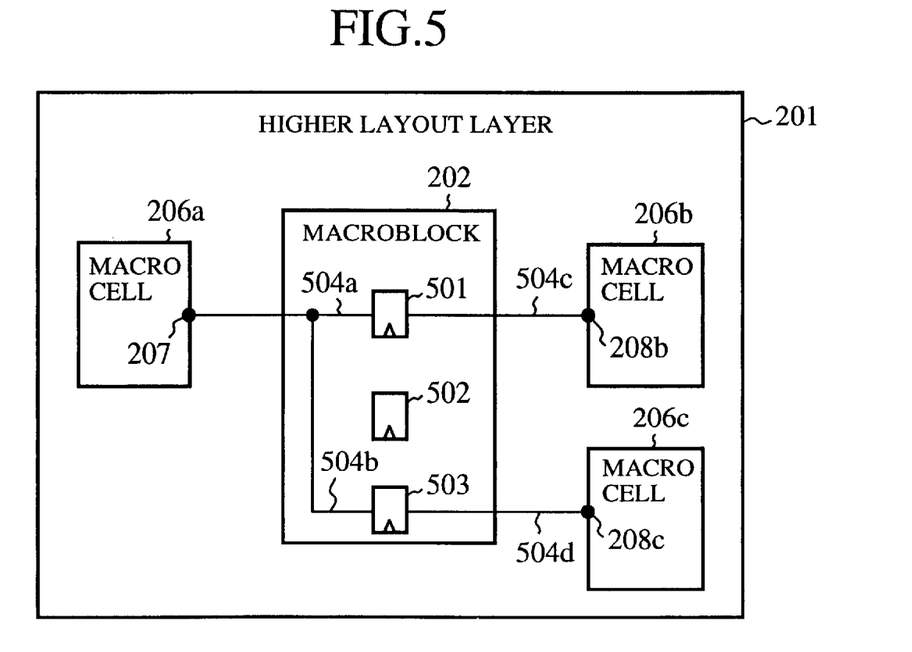
FIG. 5 is a block diagram showing the structure of a higher layout layer in which a macroblock according to a fourth embodiment of the present invention is placed.

In the above-mentioned first, second, or third embodiment, a plurality of buffers, inverters, or clock control cells, each of which serves as a through path forming cell used for forming a through path passing through a macroblock to connect a cell disposed outside the macroblock to another cell disposed outside the macroblock, are inserted into the macroblock so that they are spread over the area of the macroblock. In contrast, in accordance with a fourth embodiment of the present invention, a plurality of latches, each of which serves as a through path forming cell, can be inserted into a macroblock so that they are spread over the area of the macroblock. Referring next to FIG. 5, it illustrates a block diagram showing the structure of a higher layout layer in which the macroblock according to the fourth embodiment of the present invention is disposed. The example of the higher layout layer shows that the macroblock of the fourth embodiment is used to connect a plurality of macrocells to one another by means of latches inserted into the macroblock, when creating a layout at a higher level. In the figure, reference numeral 201 denotes the higher layout layer, and numeral 202 denotes the macroblock according to the fourth embodiment of the present invention disposed in the higher layout layer 201. In addition, reference numeral 206a denotes a cell (abbreviated as macrocell here on) for driving a net not connected to the macroblock 202, such as a macrocell, a macroblock, an I/O pin, or an I/O PAD, numeral 206b denotes a macrocell that is driven by the first macrocell 206a, numeral 207 denotes an output port of the first macrocell 206a for driving the net, and numerals 208b and 208c denotes input ports of the second and third macrocell 206b and 206c that are driven by the first macrocell, respectively. Those components correspond to the components of the first embodiment designated by the same reference numerals as shown in FIG. 1, respectively.

Reference numerals 501, 502 and 503 denote latches inserted into the macroblock 202, each of which serves as a through path forming cell used for forming a through path passing through the macroblock 202 to connect a cell disposed outside the macroblock 202 to another cell disposed outside the macroblock 202, instead of the buffers 203 to 205. The latches 501 and 503 are used to form paths passing through the macroblock 202. The latch 502 is not used to form any path passing through the macroblock 202. The macroblock 202 can involve a plurality of latches including those latches 501 to 503. The plurality of latches are inserted into the macroblock 202 so that they are spread over the area of the macroblock 202, as shown in FIG. 2, in a predetermined way, preferably, in such a way that some latches are placed in the vicinity of each of the upper, lower, left-hand, and right-hand sides of the macroblock and some latches are placed in the vicinity of the center of the macroblock. Furthermore, reference numeral 504a denotes a path for connecting the input terminal of the first latch 501 to the output port 207 of the first macrocell 206a, numeral 503b denotes a path for connecting the input terminal of the third latch 503 to the output port 207 of the first macrocell 206a, numeral 504c denotes a path for connecting the output terminal of the first latch 501 to the input port 208b of the second macrocell 206b, and numeral 504d denotes a path for connecting the output terminal of the third latch 503 to the input port 208c of the third macrocell 206c. The macroblock 202 includes a plurality of cells (not shown) that respectively implements a plurality of functions which the macroblock 202 has to perform.

When connecting the first macrocell 206a for driving the net to the second and third macrocells 206b and 206c that are driven by the first macrocell, the macroblock 202 including those latches 501 and 503 inserted thereinto thus makes it possible to connect those macrocells to one another by connecting the output port 207 of the first macrocell 206a to the input ports 208b and 208c of the second and third macrocells 206b and 206c by means of the plurality of paths 504a to 504d that do not bypass the macroblock 202. By connecting the output port 207 of the first macrocell 206a, by way of the latches 501 and 503, to the input ports 208b and 208c of the second and third macrocells 206b and 206c, the number of stages for pipeline processing can be increased.

In a variant of the present embodiment, the plurality of latches can be replaced by a plurality of flip-flops. In this case, reference numerals 501 to 503 of FIG. 3 denote flip-flops, respectively.

As previously mentioned, in accordance with the fourth embodiment, a plurality of latches (or flip-flops), each of which serves as a through path forming cell used for forming a through path passing through the macroblock 202 to connect a cell disposed outside the macroblock 202 to another cell disposed outside the macroblock 202, can be inserted into the macroblock 202 so that they are spread over the area of the macroblock 202. Accordingly, the fourth embodiment can offer the advantages of speeding up the circuitry, reducing the power consumption, reducing the area occupied by a semiconductor integrated circuit including the macroblock, and installing wiring with efficiency, like the first embodiment. In addition, the fourth embodiment offers the advantage of being able to increase the number of stages for pipeline processing, thus further speeding up the circuitry.

Embodiment 5

In the above-mentioned first, second, third, or fourth embodiment, a plurality of buffers, inverters, clock control cells, or latches, each of which serves as a through path forming cell used for forming a through path passing through a macroblock to connect a cell disposed outside the macroblock to another cell disposed outside the macroblock, are inserted into the macroblock so that they are spread over the area of the macroblock. In contrast, in accordance with a fifth embodiment of the present invention, a plurality of cells including at least two types of components selected from among buffers, inverters, clock control cells, and latches can be inserted into a macroblock so that they are spread over the area of the macroblock. The fifth embodiment can offer the same advantages as provided by the first, second, third, or fourth embodiment.

Embodiment 6

Figure 6:
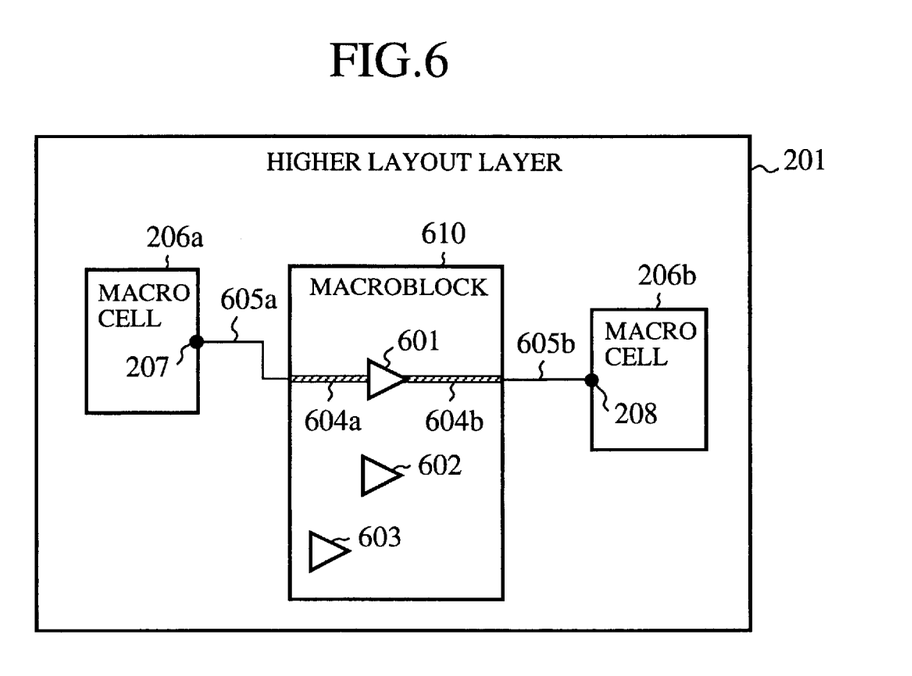
FIG. 6 is a block diagram showing the structure of a higher layout layer in which a macroblock according to a sixth embodiment of the present invention is placed.

Like the above-mentioned embodiments, a macroblock in accordance with a sixth embodiment of the present invention comprises a plurality of through path forming cells, each of which is used for forming a through path passing through the macroblock and which are inserted into the macroblock so that they are spread over the area of the macroblock in a predetermined way. The macroblock of this embodiment further includes a through path defined therein in advance of layout design and connected to each of the plurality of path forming cells, for connecting a cell disposed outside the macroblock, by way of each of the plurality of through path forming cells, to another cell disposed outside the macroblock. Referring next to FIG. 6, it illustrates a block diagram showing the structure of a higher layout layer in which the macroblock according to the sixth embodiment of the present invention is disposed. The example of the higher layout layer as show in FIG. 6 shows that the macroblock of the sixth embodiment is used to connect a plurality of macrocells to one another by means of through path forming cells inserted into the macroblock, when creating a layout at a higher level. In the figure, reference numeral 201 denotes the higher layout layer, numeral 206a denotes a cell (abbreviated as macrocell here on) for driving a net not connected to the macroblock of the sixth embodiment, such as a macrocell, a macroblock, an I/O pin, or an I/O PAD, numeral 206b denotes a macrocell that is driven by the first macrocell 206a, numeral 207 denotes an output port of the first macrocell 206a for driving the net, and numeral 208 denotes an input port of the second macrocell 206b. Those components correspond to the components of the first embodiment designated by the same reference numerals as shown in FIG. 1, respectively.

Reference numeral 610 denotes the macroblock according to the sixth embodiment of the present invention disposed in the higher layout layer 201, numerals 601, 602 and 603 denote through path forming cells each used for forming a through path passing through the macroblock 610 to connect a cell disposed outside the macroblock 610 to another cell disposed outside the macroblock 610. In this embodiment, a plurality of buffers are, as the through path forming cells, inserted into the macroblock 610 so that they are spread over the area of the macroblock 610 in a predetermined way. Needless to say, a plurality of inverters, clock control cells, latches, or flip-flops can alternatively be inserted into the macroblock 610. The through path forming cell 601 is used to form a path passing through the macroblock 610 to connect the first and second macrocells to each other. The through path forming cells 602 and 603 are not used to form any path passing through the macroblock 610. The macroblock 610 can involve a plurality of through path forming cells including the through path forming cells 601 to 603.

Furthermore, reference numeral 604a and 604b denote paths defined in the macroblock 610 in advance of layout design and connected to the first through path forming cell 601, numeral 605a denotes a path for connecting the output port 207 of the first macrocell 206a to the path 604a, and numeral 605b denotes a path for connecting the path 604b to the input port 208 of the second macrocell 206b. The macroblock 610 includes a plurality of cells (not shown) that respectively implements a plurality of functions, which are to be performed by the macroblock 610.

In this manner, by connecting the paths 605a and 605b extending from the output port 207 of the first macrocell 206a driving the net and the input port 208 of the second macrocell 206b that is driven by the first macrocell to the paths 604a and 604b defined in the macroblock 610 in advance of layout design and connected to the first through path forming cell 601, which does not bypass the macroblock 610, respectively, the first and second macrocells 206a and 206b facing with each other with the macroblock 610 between are connected to each other.

As previously mentioned, in accordance with the sixth embodiment, the macroblock 610 including a through path defined therein in advance of layout design and connected to each of a plurality of through path forming cells thus makes it possible to connect any two macrocells to each another by connecting paths extending from the output port of a first macrocell and the input port of a second macrocell to the through path connected to a selected through path forming cell. Accordingly, the sixth embodiment can offer the advantages of speeding up the circuitry, reducing the power consumption, reducing the area occupied by a semiconductor integrated circuit including the macroblock, and installing wiring with efficiency, like the first embodiment. In addition, the sixth embodiment offers the advantage of being able to eliminate a need to install wiring passing through the macroblock when creating a layout for a semiconductor integrated circuit including the macroblock, thus saving the time of searching a wiring space for a through path passing through the macroblock.

Embodiment 7

Figure 7:
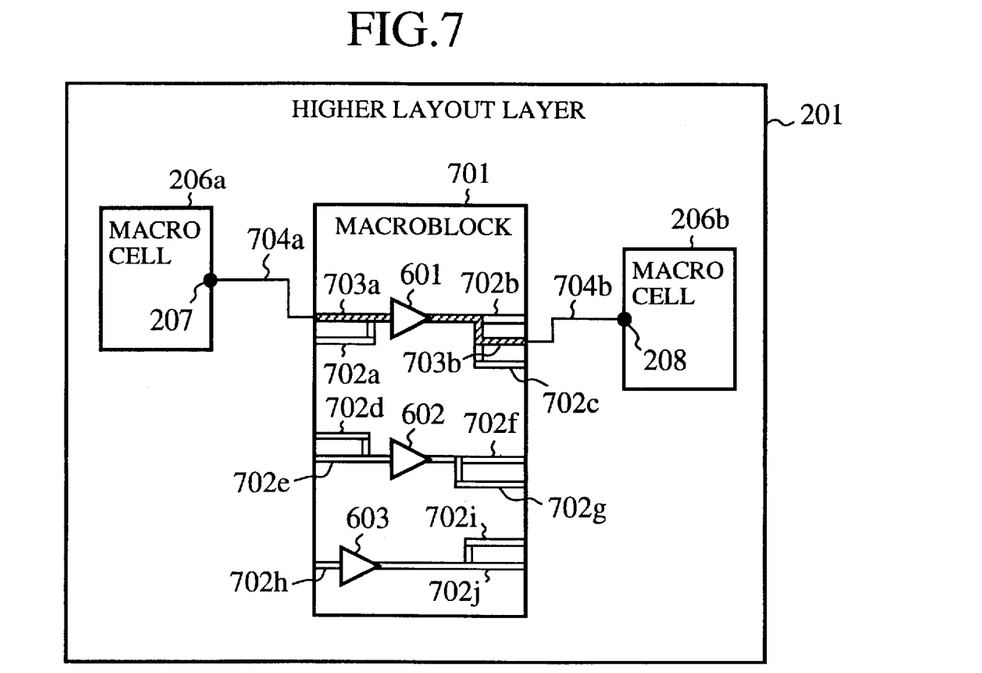
FIG. 7 is a block diagram showing the structure of a higher layout layer in which a macroblock according to a seventh embodiment of the present invention is placed.

Like the above-mentioned embodiments, a macroblock in accordance with a seventh embodiment of the present invention comprises a plurality of through path forming cells, each of which is used for forming a through path passing through the macroblock and which are inserted into the macroblock so that they are spread over the area of the macroblock in a predetermined way. The macroblock of this embodiment further includes a plurality of through path possibilities defined therein in advance of layout design and connected to each of the plurality of path forming cells, for connecting a cell disposed outside the macroblock, by way of each of the plurality of through path forming cells, to another cell disposed outside the macroblock. Referring next to FIG. 7, it illustrates a block diagram showing the structure of a higher layout layer in which the macroblock according to the seventh embodiment of the present invention is disposed. The example of the higher layout layer as show in FIG. 7 shows that the macroblock of the seventh embodiment is used to connect a plurality of macrocells to one another by means of through path forming cells inserted into the macroblock, when creating a layout at a higher level. In the figure, reference numeral 201 denotes the higher layout layer, numeral 206a denotes a cell (abbreviated as macrocell here on) for driving a net not connected to the macroblock of the seventh embodiment, such as a macrocell, a macroblock, an I/O pin, or an I/O PAD, numeral 206b denotes a macrocell that is driven by the first macrocell 206a, numeral 207 denotes an output port of the first macrocell 206a for driving the net, and numeral 208 denotes an input port of the second macrocell 206b. Those components correspond to the components of the first embodiment designated by the same reference numerals as shown in FIG. 1, respectively.

Reference numeral 701 denotes the macroblock according to the seventh embodiment of the present invention disposed in the higher layout layer 201, numerals 601, 602 and 603 denote through path forming cells inserted into the macroblock 701, each of them being used for forming a through path passing through the macroblock 701 to connect a cell disposed outside the macroblock 701 to another cell disposed outside the macroblock 701. In this embodiment, a plurality of buffers are, as the through path forming cells, inserted into the macroblock 701 so that they are spread over the area of the macroblock 701 in a predetermined way. Needless to say, a plurality of inverters, clock control cells, latches, or flip-flops can alternatively be inserted into the macroblock 701. The through path forming cell 601 is used to form a path passing through the macroblock 701 to connect the first and second macrocells to each other. The through path forming cells 602 and 603 are not used to form any path passing through the macroblock 701. The macroblock 701 can involve a plurality of through path forming cells including the through path forming cells 601 to 603.

Furthermore, reference numeral 702a to 702c, and 703a and 703b denote path possibilities defined in the macroblock 701 in advance of layout design and connected to the first through path forming cell 601, the path possibilities 703a and 703b being selected to actually establish a connection between the first and second macrocells numeral 206a and 206b by way of the first through path forming cell 601, numeral 702d to 702g denote path possibilities defined in the macroblock 701 in advance of layout design and connected to the second through path forming cell 602, numeral 702h to 702j denote path possibilities defined in the macroblock 701 in advance of layout design and connected to the third through path forming cell 603, 704a denotes a path for connecting the output port 207 of the first macrocell 206a to the path 703a, and numeral 704b denotes a path for connecting the path 703b to the input port 208 of the second macrocell 206b. The macroblock 701 includes a plurality of cells (not shown) that respectively implements a plurality of functions, which are to be performed by the macroblock 701.

In this manner, by connecting the paths 704a and 704b extending from the output port 207 of the first macrocell 206a driving the net and the input port 208 of the second macrocell 206b that is driven by the first macrocell to the paths 703a and 703b defined in the macroblock 701 in advance of layout design and connected to the first through path forming cell 601, which does not bypass the macroblock 701, respectively, the first and second macrocells 206a and 206b facing with each other with the macroblock 701 between are connected to each other.

As previously mentioned, in accordance with the seventh embodiment, the macroblock 701 including a plurality of through path possibilities defined therein in advance of layout design and connected to each of a plurality of through path forming cells thus makes it possible to connect any two macrocells to each another by selecting a desired through path possibility from the plurality of through path possibilities connected to a selected through path forming cell, and connecting paths extending from the output port of a first macrocell and the input port of a second macrocell to the selected through path. Accordingly, the seventh embodiment can offer the advantages of speeding up the circuitry, reducing the power consumption, reducing the area occupied by a semiconductor integrated circuit including the macroblock, and installing wiring with efficiency, like the first embodiment. In addition, the seventh embodiment offers the advantage of being able to eliminate a need to install wiring passing through the macroblock by selecting a desired through path possibility from the plurality of through path possibilities connected to a selected through path forming cell to actually establish a connection between any two cells disposed outside the macroblock when creating a layout for a semiconductor integrated circuit including the macroblock, thus saving the time of searching a wiring space for a through path passing through the macroblock.

Embodiment 8

A macroblock as previously explained in Embodiment 1 to Embodiment 7 can be converted into intellectual property or IP and stored as an IP core in a computer-readable storage medium. The IP core can include information on a plurality of through path forming cells, and the configuration and property of wiring in addition to the information on the macroblock.

Embodiment 9

Figure 8:
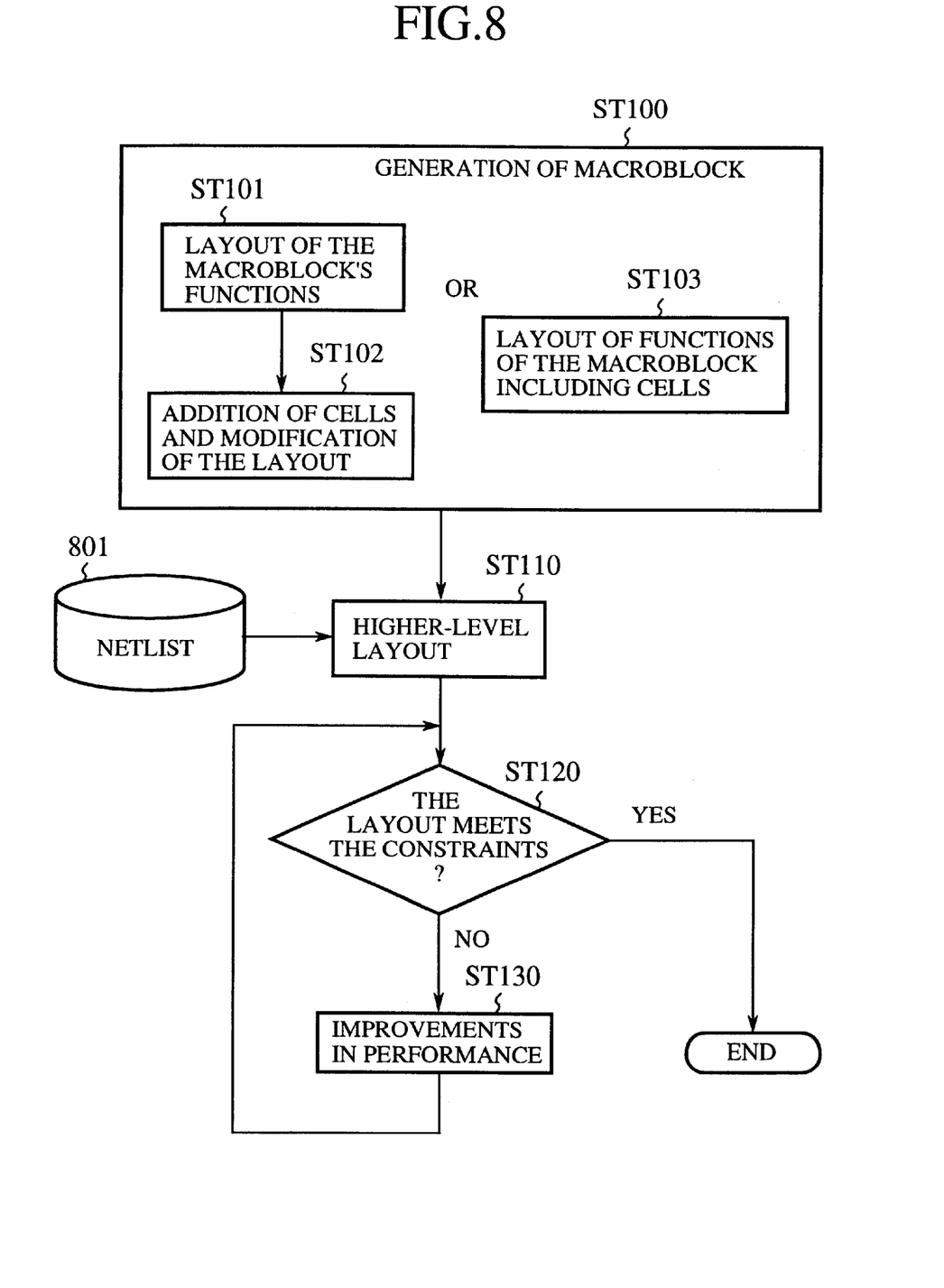
FIG. 8 is a flow diagram showing a method of creating a layout for a semiconductor integrated circuit using a macroblock, according to a ninth embodiment of the present invention.

Referring next to FIG. 8, it illustrates a flow diagram showing a method of creating a layout for a semiconductor integrated circuit using a macroblock as previously explained in Embodiment 1 to Embodiment 7 and IP associated with the macroblock, according to a ninth embodiment of the present invention.

First, a macroblock is produced in step ST100. In order to generate a macroblock, the macroblock is laid out first using a general method in step ST101. After that, in step ST102, one or more through path forming cells each used for forming a path passing through the macroblock are added to the macroblock to modify the layout produced in step ST101. As an alternative, a macroblock into which one or more through path forming cells are inserted in advance can be laid out in step ST103.

Before producing a higher-level layout, a netlist 801 including information on logical connections is prepared. Using the method of the ninth embodiment, a higher-level layout for the macroblock, into which the plurality of through path forming cells are inserted so that they are spread over the area of the macroblock in a predetermined way, is created using the netlist 801, in step ST110. After that, the method advances to step ST120 in which it checks whether the produced layout meets constraints on the timing, power consumption, and voltage drops in the semiconductor integrated circuit including the macroblock. If the checking result indicates that the produced layout is good, the layout design is finished. In contrast, unless the checking result indicates that the produced layout is good, the method branches to step ST130 in which it creates a new layout for the macroblock using the plurality of through path forming cells as well to improve the performance characteristics of the semiconductor integrated circuit. For example, a different through path forming cell is selected to form a through path passing through the macroblock and connecting two cells in question located outside the macroblock to each other. As an alternative, wiring that goes around the macroblock can be installed to connect two cells in question located outside the macroblock to each other. After that, the method returns to step ST120 in which it checks again whether the produced layout meets constraints on the timing, power consumption, and voltage drops in the semiconductor integrated circuit. The checking and improving processes are repeated, until the checking result obtained in step ST120 indicates that the produced layout is good.

As previously mentioned, the layout design method in accordance with the ninth embodiment makes it possible to produce a layout for a semiconductor integrated circuit including a macroblock using a netlist prepared in advance of layout design and to explore different layout possibilities for the macroblock to improve the performance characteristics of the semiconductor integrated circuit using a plurality of through path forming cells as well, the through path forming cells being inserted into the macroblock in advance of layout design so that they are spread over the area of the macroblock in a predetermined way. Accordingly, the ninth embodiment can offer the advantages of speeding up the circuitry, reducing the power consumption, reducing the area occupied by a semiconductor integrated circuit including the macroblock, and installing wiring with efficiency.

Embodiment 10

Figure 9:
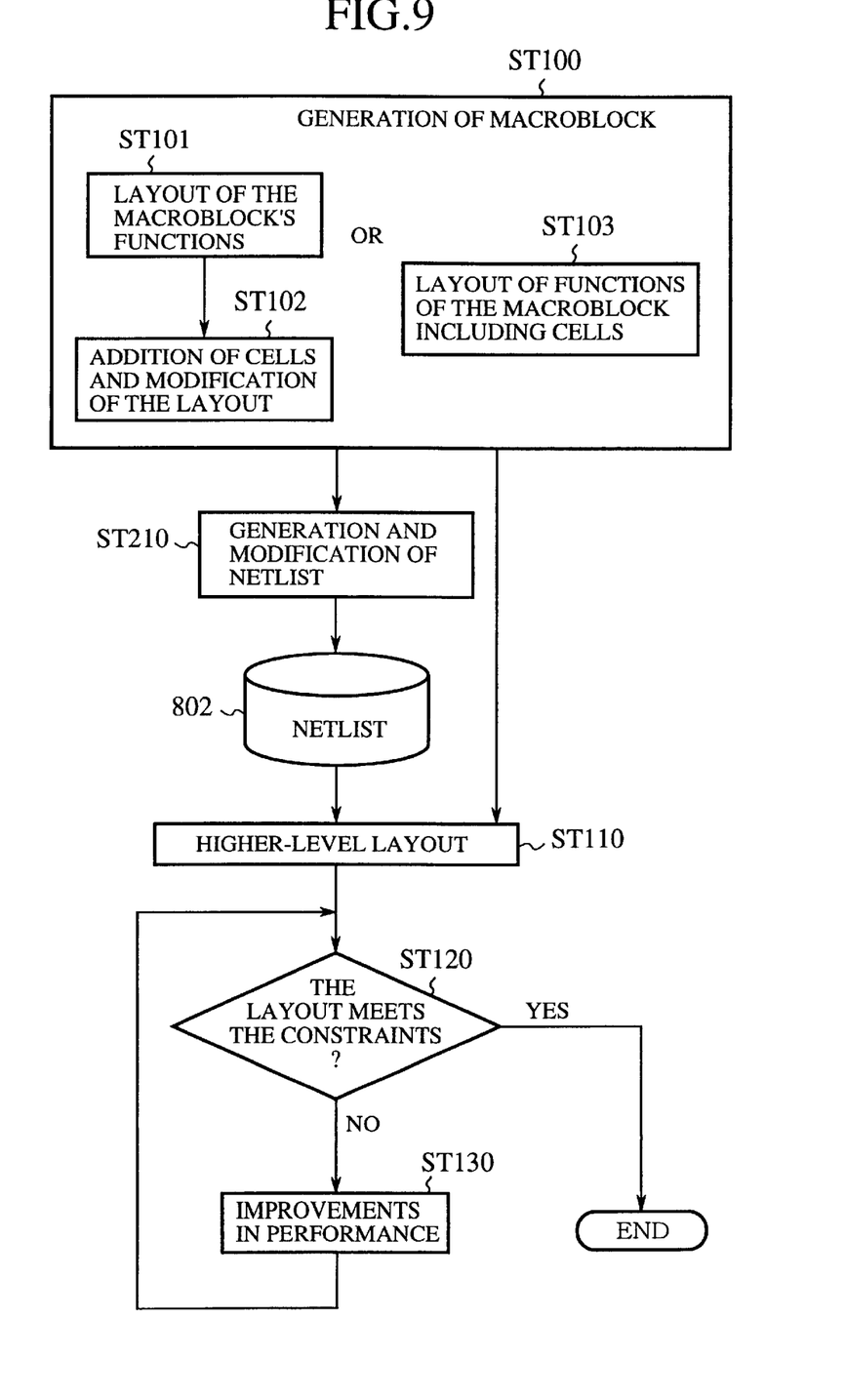
FIG. 9 is a flow diagram showing a method of creating a layout for a semiconductor integrated circuit using a macroblock, according to a tenth embodiment of the present invention.

In accordance with a tenth embodiment of the present invention, a method comprises the step of creating or modifying a netlist in consideration of a plurality of through path forming cells inserted into a macroblock before creating a layout for a semiconductor integrated circuit including the macroblock. Referring next to FIG. 9, it illustrates a flow diagram showing a method of creating a layout for a semiconductor integrated circuit according to the tenth embodiment.

First, a macroblock is produced in step ST100. In order to generate a macroblock, the macroblock is laid out first using a general method in step ST101, like the first embodiment mentioned above. After that, in step ST102, one or more through path forming cells each used for forming a path passing through the macroblock are added to the macroblock to modify the layout produced in step ST101. As an alternative, a macroblock into which one or more through path forming cells are inserted in advance can be laid out in step ST103.

Next, a higher-level layout is created. First, a netlist 802 including information on logical connections is constructed in consideration of the plurality of through path forming cells that are inserted into the macroblock so that they are spread over the area of the macroblock. The information on the plurality of through path forming cells can be stored in the IP core. As an alternative, the netlist 802 can be obtained by modifying a one prepared in advance in consideration of the plurality of through path forming cells. Using the method of the tenth embodiment, a higher-level layout for the macroblock, into which the plurality of through path forming cells are inserted so that they are spread over the area of the macroblock in a predetermined way, is created using the netlist 802, in step ST110. After that, the method advances to step ST120 in which it checks whether the produced layout meets constraints on the timing, power consumption, and voltage drops in the semiconductor integrated circuit including the macroblock, like the ninth embodiment. If the checking result indicates that the produced layout is good, the layout design is finished. In contrast, unless the checking result indicates that the produced layout is good, the method branches to step ST130 in which it creates a new layout for the macroblock using the plurality of through path forming cells as well to improve the performance characteristics of the semiconductor integrated circuit. The checking and improving processes are repeated until the checking result obtained in step ST120 indicates that the produced layout is good.

As previously mentioned, the layout design method in accordance with the tenth embodiment makes it possible to produce a layout for a semiconductor integrated circuit including a macroblock using a netlist modified in consideration of a plurality of through path forming cells and to explore different layout possibilities for the macroblock to improve the performance characteristics of the semiconductor integrated circuit using the plurality of through path forming cells as well, the through path forming cells being inserted into the macroblock in advance of layout design so that they are spread over the area of the macroblock in a predetermined way. Accordingly, the tenth embodiment can offer the advantages of further speeding up the circuitry, further reducing the power consumption, further reducing the area occupied by a semiconductor integrated circuit including the macroblock, and installing wiring with more efficiency.

Many widely different embodiments of the present invention may be constructed without departing from the spirit and scope of the present invention. It should be understood that the present invention is not limited to the specific embodiments described in the specification, except as defined in the appended claims.

What is claimed is:

1. A macroblock that is treated as a single unit when creating a layout for a semiconductor integrated circuit, said macroblock comprising:

at least a cell for implementing one or more functions which said macroblock has to perform;

a plurality of through path forming cells selected from at least one of buffers, inverters, latches and clock control cells for controlling a clock applied thereto, each used for forming a through path passing through said macroblock, said plurality of through path forming cells being inserted into said macroblock in advance of creating a layout for a semiconductor integrated circuit so that said through path forming cells are spread over said macroblock in a predetermined way; and a plurality of through path possibilities defined in said macroblock in advance of creating a layout for a semiconductor integrated circuit and connected to each of said plurality of through path forming cells, one of said plurality of through path possibilities being selected to establish connection between cells disposed outside said macroblock when creating a layout for a semiconductor integrated circuit.

2. The macroblock according to claim 1, further comprising a through path defined in said macroblock in advance of creating a layout for a semiconductor integrated circuit and connected to each of said plurality of through path forming cells, for establishing connection between cells disposed outside said macroblock.

3. A computer-readable storage medium including an intellectual property or IP core, said IP core comprising:

information on a macroblock used when creating a layout for a semiconductor integrated circuit;

information on a plurality of through path forming cells each used for forming a through path passing through said macroblock, said plurality of through path forming cells being inserted into said macroblock; and information on a plurality of through path possibilities defined in said macroblock in advance of creating a layout for a semiconductor integrated circuit and connected to each of said plurality of through path forming cells, one of said plurality of through path possibilities being selected to establish connection between cells disposed outside said macroblock when creating a layout for a semiconductor integrated circuit.

4. A method of creating a layout for a semiconductor integrated circuit using at least a macroblock, said macroblock including:

a plurality of through path forming cells, each used for forming a through path passing through said macroblock, said plurality of through path forming cells being inserted into said macroblock in advance of creating a layout for a semiconductor integrated circuit so that said plurality of through path forming cells are spread over said macroblock in a predetermined way, wherein said method comprising the steps of defining a plurality of through path possibilities in said macroblock in advance of creating a layout for a semiconductor integrated circuit and connected to each of said plurality of through path forming cells;

selecting one of said plurality of through path possibilities to establish connection between cells disposed outside said macroblock when creating a layout for a semiconductor integrated circuit;

creating a layout for said macroblock into which said plurality of through path forming cells are inserted using a netlist including information on logical connections, to create a new layout for said macroblock using said plurality of through path forming cells as well unless layout results meet the constraints, and repeating said creating step until the layout results meet the constraints, and wherein said netlist being prepared in advance of creating the layout, determining whether layout results stay with predetermined limitations, or said netlist being created or modified in consideration of said plurality of through path forming cells, determining whether layout results meet constraints.

* * * * *